(12) United States Patent
Kayano

(10) Patent No.: US 9,709,646 B2
(45) Date of Patent: Jul. 18, 2017

(54) MAGNETIC RESONANCE IMAGING APPARATUS USING SUPERCONDUCTING ARRAY ANTENNA

(71) Applicant: Kabushiki Kaisha Toshiba, Minato-ku (JP)

(72) Inventor: Hiroyuki Kayano, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 401 days.

(21) Appl. No.: 14/483,756

(22) Filed: Sep. 11, 2014

(65) Prior Publication Data

US 2015/0084634 A1   Mar. 26, 2015

(30) Foreign Application Priority Data

Sep. 25, 2013 (JP) ................................. 2013-197862
Aug. 18, 2014 (JP) ................................. 2014-165936

(51) Int. Cl.
| G01R 33/36 | (2006.01) |
| G01R 33/34 | (2006.01) |
| G01R 33/38 | (2006.01) |
| G01R 33/3815 | (2006.01) |
| G01R 33/383 | (2006.01) |

(52) U.S. Cl.
CPC ... *G01R 33/3621* (2013.01); *G01R 33/34023* (2013.01); *G01R 33/383* (2013.01); *G01R 33/3804* (2013.01); *G01R 33/3815* (2013.01)

(58) Field of Classification Search
CPC .......... G01R 33/3621; G01R 33/34023; G01R 33/383; G01R 33/3815; G01R 33/3804
See application file for complete search history.

(56) References Cited

U.S. PATENT DOCUMENTS

| 6,377,047 B1* | 4/2002 | Wong ............... G01R 33/34076 324/318 |
| 2008/0191696 A1* | 8/2008 | Van Der Burgt ...... B60N 3/008 324/318 |
| 2008/0204027 A1* | 8/2008 | Luedeke ............ G01R 33/3692 324/322 |
| 2008/0278166 A1 | 11/2008 | Wosik et al. |

(Continued)

FOREIGN PATENT DOCUMENTS

| CN | 101322041 A | 12/2008 |
| CN | 102309324 A | 1/2012 |

(Continued)

OTHER PUBLICATIONS

Combined Chinese Office Action and Retrieval Report issued Jun. 13, 2016 in Patent Application No. 201410460840.6 (with English language translation).

(Continued)

*Primary Examiner* — G. M. Hyder
(74) *Attorney, Agent, or Firm* — Oblon, McClelland, Maier & Neustadt, L.L.P.

(57) ABSTRACT

A magnetic resonance imaging apparatus of an embodiment includes a housing, a static magnet field source having a superconducting coil or a permanent magnet, and a superconducting array antenna which are provided inside of the housing. The superconducting array antenna includes an A/D conversion element configured to convert a received analog signal into a digital signal.

14 Claims, 7 Drawing Sheets

(56) References Cited

U.S. PATENT DOCUMENTS

| | | | |
|---|---|---|---|
| 2009/0136104 A1 | 5/2009 | Hajian et al. | |
| 2009/0219024 A1* | 9/2009 | Matschl | G01R 33/34076 324/318 |
| 2010/0301865 A1 | 12/2010 | Yamashita | |
| 2011/0011102 A1 | 1/2011 | Gao et al. | |
| 2011/0015078 A1* | 1/2011 | Gao | G01R 33/3403 505/162 |
| 2011/0124507 A1 | 5/2011 | Wosik et al. | |
| 2012/0074936 A1 | 3/2012 | Kayano | |
| 2012/0161772 A1 | 6/2012 | Biber et al. | |
| 2013/0063148 A1 | 3/2013 | Ma et al. | |
| 2015/0084635 A1* | 3/2015 | Kawaguchi | G01R 33/3804 324/322 |

FOREIGN PATENT DOCUMENTS

| | | |
|---|---|---|
| CN | 102597794 A | 7/2012 |
| JP | 2011-5238 | 1/2011 |
| JP | 2012-68167 | 4/2012 |
| WO | WO 2012-155002 A1 | 11/2012 |

OTHER PUBLICATIONS

Extended European Search Report issued Dec. 18, 2014 in Patent Application No. 14184359.9.

C. Possanzini et al., "dStream Architecture", XP055157780, Retrieved from the Internet: URL:http://www.healthcare.philips.com/pwc_hc/main/products/mri/technology/dStream/assets/digital-revolution-in-MRI.pdf, Jan. 1, 2011, 16 pages.

Oleg A.Mukhanov et al., "Superconductor Analog-to-Digital Converters", Proceedings of the IEEE, vol. 92, No. 10, XP011118881, Oct. 1, 2004, pp. 1564-1584.

Igor V. Vernik et al., "Progress in the Development of Cryocooled Digital Channelizing RF Receivers", IEEE Transactions on Applied Superconductivity, vol. 19, No. 3, XP011263584, Jun. 1, 2009, pp. 1016-1021.

* cited by examiner

MAGNETIC RESONANCE IMAGING APPARATUS USING SUPERCONDUCTING ARRAY ANTENNA

CROSS-REFERENCE TO RELATED APPLICATION

This application is based upon and claims the benefit of priority from Japanese Patent Applications No. 2013-197862, filed on Sep. 25, 2013 and No. 2014-165936, filed on Aug. 18, 2014; the entire contents of which are incorporated herein by reference.

FIELD

Embodiments described herein relate to a magnetic resonance imaging apparatus.

BACKGROUND

A magnetic resonance imaging (MRI) apparatus is an apparatus for capturing an image in a subject body by using magnetic resonance phenomenon. Such MRI apparatus has various kinds of apparatus required to capture images in a subject body, such as an external magnet for generating a static magnet field in an image-capturing area, a gradient magnetic field coil for applying a gradient magnetic field to the subject body placed in the static magnet field, and a high frequency coil for applying a high frequency pulse for applying a high frequency pulse to the subject body. The external magnet is made of a superconducting magnet using a superconducting coil, which can generate a strong static magnet field.

In the MRI, a coil (antenna) for receiving magnetic resonance phenomenon is provided on the surface of the subject body. The reception coil provided on the surface of the subject body is adjusted at an image-capturing portion, and the one adjusted at the image-capturing portion is required. The reception coil arranged on the surface of the subject body gives oppressive feeling to the subject body.

DETAILED DESCRIPTION

A magnetic resonance imaging apparatus of an embodiment includes a housing, a static magnet field source having a superconducting coil or a permanent magnet, and a superconducting array antenna which are provided inside of the housing. The superconducting array antenna includes an A/D conversion element configured to convert a received analog signal into a digital signal.

First Embodiment

Figure 1:
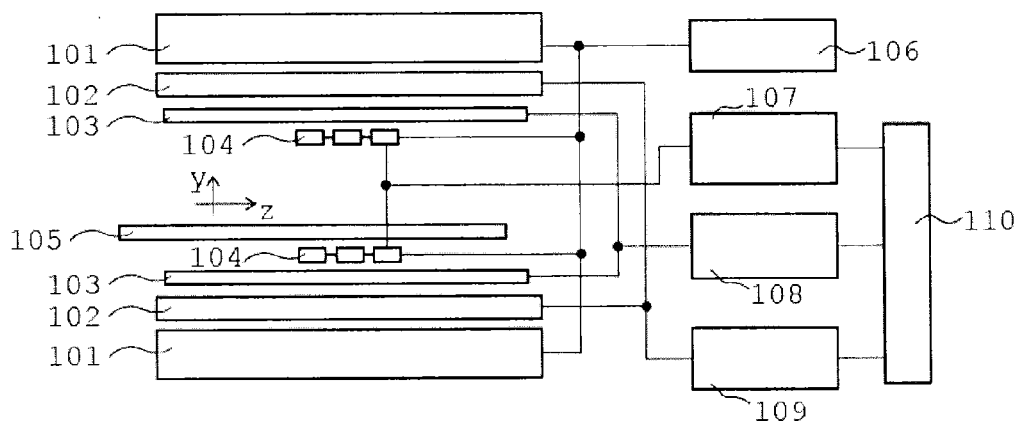
FIG. 1 is a configuration schematic view illustrating a magnetic resonance imaging apparatus according to an embodiment.

A magnetic resonance imaging apparatus according to the first embodiment includes a superconducting antenna serving as a reception antenna in a housing, and includes, within the reception antenna, an element for converting an analog signal received by the reception antenna into a digital signal. FIG. 1 illustrates a configuration schematic diagram of the magnetic resonance imaging apparatus according to the embodiment. A magnetic resonance imaging apparatus 100 of FIG. 1 includes a static magnet field source 101, a gradient magnetic field coil 102, a transmission coil 103, reception antennas 104, a cooling device 106, a reception unit 107, a transmission unit 108, a gradient magnetic field electric power supply 109, and a control device 110. In the image-capturing range, a top plate 105 is provided. Examples of subject bodies of the magnetic resonance imaging apparatus include animals including a person and chemical substances.

The static magnet field source 101, the gradient magnetic field coil 102, the transmission coil 103, and the reception antenna 104 are provided in the housing of the magnetic resonance imaging apparatus.

The magnetic resonance imaging according to the embodiment may be NMR (Nuclear Magnetic Resonance), MRI, and ESR (Electron Spin Resonance). For example, the MRI includes special image-capturing such as MRA (Magnetic Resonance Angiography and MRS (Magnetic Resonance Spectroscopy).

The static magnet field source 101 is an external magnet generating a static magnet field in the image-capturing area where the subject body is placed. The external magnet is a magnet of a horizontal magnetic field method. For example, the static magnet field source 101 includes a vacuum container, a refrigerant container, and a superconducting coil. An electric power supply, not shown, for providing an electric current to the superconducting coil is connected to the static magnet field source 101. The superconducting coil is cooled by cooling refrigerant (cryogen) including liquid helium and liquid nitrogen. The vacuum container is formed in a substantially cylindrical shape, and the inside of the wall of the cylinder is kept in the vacuum state. The space formed inside of the vacuum container serves as the image-capturing area where the subject body is placed. The refrigerant container (first refrigerant container) is formed in a substantially cylindrical shape, and is accommodated inside of the wall of the cylinder of the vacuum container. It should be noted that, in a typical example, the refrigerant container has liquid helium as refrigerant inside of the wall of the cylinder in order to keep the inside of the container in a sufficiently low temperature state. The superconducting coil is arranged inside of the wall of the cylinder of the refrigerant container and is immersed in the liquid helium. This superconducting coil generates a static magnet field in the image-capturing area which exists inside of the vacuum container. It should be noted that at least a portion of the vacuum container is preferably covered with a refrigerant container (second refrigerant container) accommodating a cooling refrigerant including liquid helium, liquid nitrogen, or the like, which alleviates the heat given from the outside. In addition, a correction magnet may be further provided to uniformize the magnetic field. The cooling device 106 is, for example, a device for liquefying the evaporated cooling refrigerant, and is preferably provided in the magnetic resonance imaging apparatus. This cooling device 106 is preferably operated at all times even when the magnetic resonance imaging apparatus 100 is not operating, so that the static magnet field source 101 is always kept in the superconducting state.

The gradient magnetic field coil 102 is formed in a substantially cylindrical shape, and is arranged inside of the static magnet field source 101 in the housing. The gradient magnetic field coil 102 controls the image-capturing direction. The gradient magnetic field coils 102 in x axis, y axis, and z axis directions are provided. These gradient magnetic field coils 102 use an electric current provided from the gradient magnetic field electric power supply 109 to generate gradient magnetic fields in the x axis, y axis, z axis directions which are set in the image-capturing area in accordance with the corkscrew rule. The gradient magnetic field coils 102 repeatedly receive pulse electric currents during the image-capturing process.

The transmission coil 103 is arranged inside of the housing. More specifically, the transmission coil 103 is arranged inside of the gradient magnetic field coils 102 in the housing. This transmission coil 103 emits a high frequency pulse transmitted from the transmission unit 108 to the subject body placed in the image-capturing area. The transmission coil 103 generates a rotational magnetic field rotating within a plane perpendicular to the static magnet field. When the magnetic resonance phenomenon is used, the high frequency pulse can change nucleus from the ground state to the excited state or from the excited state to the ground state. The frequency of the high frequency pulse is the precession movement frequency of the nucleus. When electron spin resonance is used, the precession movement frequency of the electron is likewise used.

The reception antenna 104 is arranged in the housing. More specifically, the reception antenna 104 is arranged inside of the gradient magnetic field coil 102 inside of the static magnet field source 101. The reception antenna 104 receives the electromagnetic wave generated from the subject body in response to the pulses emitted from the transmission coil 103. The received analog signal is converted by an A/D conversion element in the reception antenna 104 into a digital signal. The converted digital signal is transmitted to the reception unit 107 by an optical wiring or a conductive wiring. In the embodiment, an externally-attached reception antenna optimized for the image-capturing portion of the subject body is not used, and instead, the reception antenna 104 incorporated into the housing is used. A single row of reception antennas 104 may be provided, or as shown in FIG. 1, multiple rows of reception antennas 104 may be provided. Multiple rows of reception antennas 104 can reduce the image-capturing time, which is preferable from the perspective of obtaining high resolution captured images. As the number of antennas increases, it is also preferable to increase the efficiency of the image processing. This means that a higher number of antennas enables the antenna to attain a higher directivity. With a higher directivity, the direction in which a single antenna receives radio wave is narrowed, and this increases the speed of the signal analysis. Since the number of antennas increases, the signal received by the antennas are preferably sent via optical wirings to the control device 110 and external devices. With the higher directivity of the antennas, the slice width is preferably thinned, and the rows of the slice can be preferably made into still more number of rows.

A reception antenna preferably includes an A/D conversion element for converting the received analog signal into a digital signal. The reception antenna 104 is cooled for a superconducting antenna. This cooling is employed for the A/D conversion element in the reception antenna 104. The A/D conversion element cooled and maintained at a predetermined temperature exhibits less thermal fluctuations, and is less likely to generate thermal noises which are main causes of noises in the conversion. Therefore, this allows the bit resolution of the A/D conversion element to be fully made use of. Since this configuration allows for low noise conversion from analog to digital, the apparatus according to the embodiment uses the superconducting antenna as the reception antenna 104 and has the A/D conversion element arranged in the reception antenna 104, and therefore, it is not necessary to amplify the signal before conversion into the digital signal. It is not necessary to perform signal amplification which amplifies even a noise signal before the digital conversion, and in addition, the signal would not have distortion caused by nonlinearity of the amplification device for the signal amplification, and therefore, the apparatus according to the embodiment has an advantage in that no signal distortion would be caused.

Before converting the analog signal into a digital signal, band width restriction is preferably applied to the analog signal using the frequency filter arranged in the reception antenna 104. In this case, the A/D conversion element is an element for converting the signal of which band width has been restricted by the filter. The frequency filter is preferably a superconducting filter. With the band width restriction, noise signals such as harmonics included in the analog signal can be removed. Alternatively, multiple filters may be provided, and the multiple filters may apply band width restrictions to the frequency bands respectively. When the analog signal is converted into a digital signal in each of the different frequency bands, the signals in the frequency bands can be processed respectively in parallel. The parallel processing is preferable from the perspective of increase of image processing. In this case, the A/D conversion element is an element for converting analog signals of the frequency bands of which band width has been restricted by the filters into digital signals.

With this configuration, the reception antenna 104 according to the embodiment can convert the analog signal received by the element of the antenna into a digital signal with extremely low distortion and low noise. In the embodiment, there are more antennas, which also increase the directivity, and therefore, a single antenna can obtain an extremely pure signal as a digital signal from a narrow area. Since the single antenna obtains such digital signal, this allows for extremely easy post processing, which increases the speed of the signal processing. Further, the image data obtained by processing such an extremely pure digital signal are expected to be lower noise and higher resolution than an image obtained by a conventional apparatus. When a conventional external reception antenna converts a received signal into a digital signal, it is affected by not some little distortion and noises during the conversion, but in the embodiment, such influence is eliminated as much as possible, and therefore, the signal is expressed as "pure signal" in the above description. The antenna size of the conventional reception antenna is large, and therefore, the area covered by a single antenna of the conventional reception antenna is extremely larger than that covered by the reception antenna of the embodiment.

An externally-attached reception antenna effectively receives a weak electromagnetic wave from a test subject, and therefore, an antenna suitable for an image-capturing portion of a subject body is arranged in contact with the subject body or in proximity to the surface of the subject body. When the antenna is arranged in the housing of the magnetic resonance imaging apparatus, the distance between the reception antenna and the subject body is far, and therefore, a measurable electromagnetic wave cannot be received.

Instead of the above method, the reception antenna 104 can have the function of the transmission coil. An antenna may be shared for transmission and reception, and more specifically, an antenna, a transmission/reception circuit, and a transmission/reception switching unit may be provided. In the reception antenna 104, a band pass filter and a low noise signal amplification device for processing the signal received by the reception antenna 104 may be provided in the housing such as the reception antenna 104. The band pass filter can use a superconducting filter, and therefore, the cooling for the antenna and the superconducting magnet may be used to make it into a superconducting state. The low noise signal amplification device can amplify the signal with a lower distortion under a low temperature environment. In this case, the transmission coil 103 is omitted.

In the embodiment, the reception antenna 104 preferably uses a superconducting antenna. More preferably, the reception antenna 104 is a superconducting array antenna made by stacking superconducting antennas. In the superconducting array antenna, the antenna pattern is precise, and the loss is small, and this enables the antenna to be made into smaller sizes. Because the loss is low, the gain of the antenna is high. BY stacking the antennas, the gain and the directivity of the antennas are improved. The pattern shape of the superconducting antenna may be monopole, dipole, crank types, spiral types such as rectangular, circular, oval shapes. In order to support various kinds of image-capturing methods, the reception antenna 104 is more preferably a phased array antenna capable of beam scanning.

The superconducting array antenna according to the embodiment preferably includes an array antenna made by stacking a patch antenna having an antenna made of a superconducting material and a ground pattern on a low-loss dielectric substrate from a short wave band to an extremely-high frequency band, a superconducting filter configured to restrict band width of an analog signal received by a conductive array antenna, and an A/D conversion element configured to convert an analog signal into a digital signal.

Figure 2:
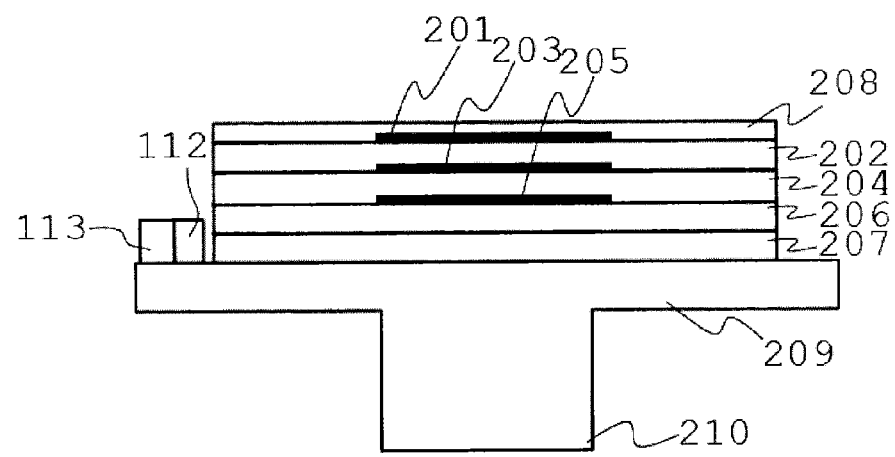
FIG. 2 is a schematic view illustrating a reception antenna according to the embodiment.

The schematic diagram of FIG. 2 shows a schematic diagram of the reception antenna 104 according to the embodiment. The reception antenna 104 includes a first superconducting antenna layer 201, a first substrate 202, a second superconducting antenna layer 203, a second substrate 204, a third superconducting antenna layer 205, a third substrate 206, a superconducting ground layer 207, an infrared reflection film 208, a cold head 209, a cooling medium 210, a superconducting filter 112, and an A/D conversion element 113.

As shown in the schematic diagram of FIG. 2, the array antenna according to the embodiment (reception antenna 104) includes a first superconducting antenna layer 201, a first substrate 202, a second superconducting antenna layer 203, a second substrate 204, a third superconducting antenna layer 205, a third substrate 206, and a superconducting ground layer 207 which are stacked in this order. An antenna layer is provided with a feeding path not shown. The feeding path is connected to the reception unit 107 not shown in FIG. 2. Each superconducting antenna layer is connected to the feeding path and the ground layer. The superconducting antenna layer includes an antenna pattern made by processing an oxide superconducting film including one or more types of chemical elements such as Y, Ba, Cu, La, Ta, Bi, Sr, Ca, Pb into a desired antenna pattern shape, and also includes a feeding path and a ground pattern.

The infrared reflection film 208 is a film for preventing infrared light heating the antenna from being incident upon the antenna. The infrared reflection film 208 is provided on the surface of the antenna (first superconducting antenna layer 201), and prevents the infrared light heating the superconducting antenna layer from being incident thereupon. The infrared reflection film 208 is, for example, a multi-layer film of metal oxide. For example, when there is no infrared light source, the infrared reflection film 208 may be omitted.

The cold head 209 is a member for holding the array antenna and having a high thermal conductivity for cooling the array antenna. The cold head 209 is cooled by being thermally connected to the cooling medium 210. The cooling temperature is different according to the superconducting oxide film of the array antenna, and is, for example, 77 K or less.

The cooling medium 210 is a member for cooling the cold head 209 for cooling the array antenna. The cooling medium 210 may be cooled by a refrigerator for an array antenna, or it may be cooled together with a cooling member such as a cooling refrigerant including liquid helium or liquid nitrogen used for cooling the superconducting coil of the static magnet field source 101. The cooled cold head 209 may be substituted for the cooling medium 210, and the cooling medium 210 may be omitted.

The superconducting filter 112 and the A/D conversion element 113 are preferably arranged in an environment where there is less temperature fluctuation at a cool temperature of the reception antenna 104 and the like in the housing 111. As long as it is an environment where there is less temperature fluctuation at a cool temperature, the superconducting filter 112 and the A/D conversion element 113 may be outside of the reception antenna 104, but from the perspective of reducing the conversion loss into a digital signal, the superconducting filter 112 and the A/D conversion element 113 are preferably arranged in the reception antenna 104. When the superconducting filter 112 and the A/D conversion element 113 are arranged in the reception antenna 104, the superconducting filter 112 and the A/D conversion element 113 are preferably arranged for the cold head 209 and the cooling medium 210. The superconducting filter 112 and the A/D conversion element 113 are connected via wires not shown to the antenna pattern wiring of the antenna layer. The signal converted into the digital signal is sent to the reception unit 107. The A/D conversion element 113 is arranged in any given preferable environment where low fluctuation and low noise conversion are possible other than the superconducting low temperature environment.

Figure 3:
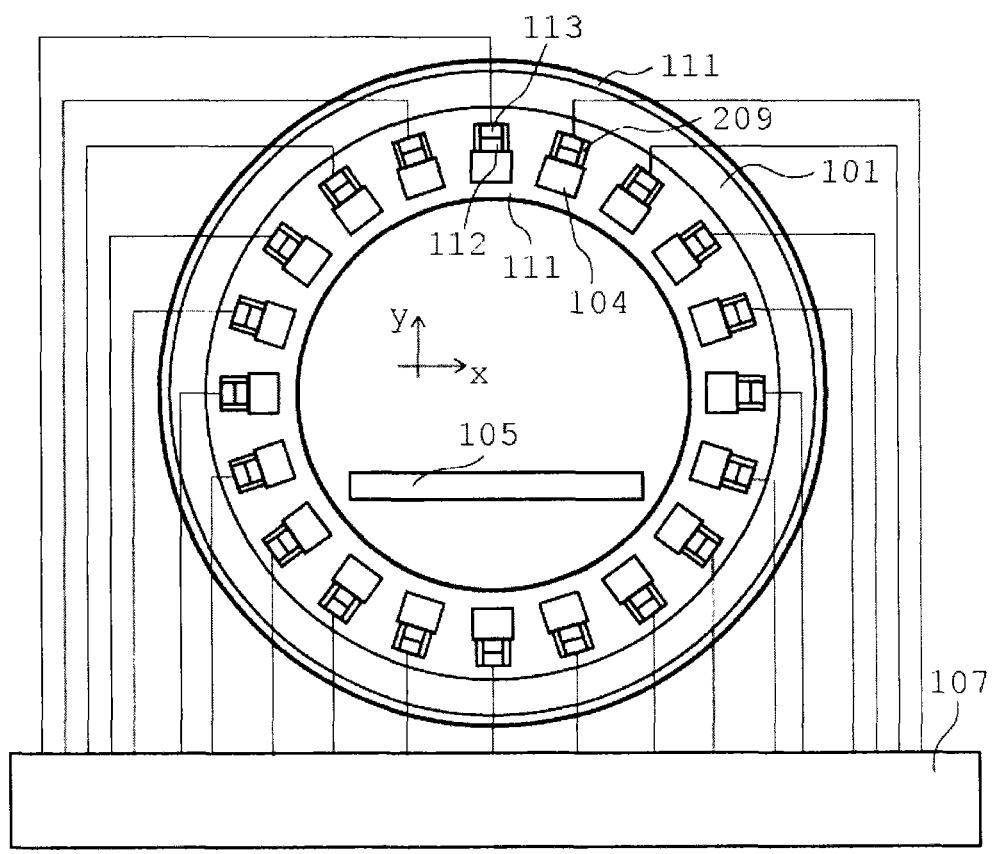
FIG. 3 is a schematic view illustrating a magnetic resonance imaging apparatus according to the embodiment.

Subsequently, FIG. 3 illustrates a cross sectional schematic view of a magnetic resonance imaging apparatus having the reception antenna 104 according to the embodiment provided inside of the housing. The magnetic resonance imaging apparatus shown in the schematic view of FIG. 3 includes a static magnet field source 101, a reception antenna 104, a superconducting filter 112, an A/D conversion element 113, a cooling medium 210, and a reception unit 107, which are provided in the housing 111, and the top plate 105 on which the test subject is placed when images are captured is arranged in the image-capturing area. The reception antenna 104 is arranged inside of the static magnet field source 101. An output unit, not shown, of each reception antenna 104 and the reception unit 107 are connected via a wire, and the signal received by the reception antenna 104 is passed through the wire and is transmitted to the reception unit 107.

A central portion C of the housing 111 is an area X of a center portion of the housing. The reception antenna 104 is preferably arranged so that the directivity thereof is oriented toward the central portion $C_1$ (for example, $(x_1, y_1, z_1)$). When multiple rows of reception antennas 104 are provided, the reception antenna 104 in each row is preferably arranged so that the directivity thereof is oriented toward the central portion $C_1$ (for example, $(x_1, y_1, z_a)$) with only the deviation in the z axis direction. The reception antenna 104 is oriented in the direction of the central portion C. The reception antennas 104 are arranged on a (virtual) circumference so as to draw a circumference at the inner peripheral side of the static magnet field source 101. From the perspective of reducing the difference in the characteristics between the antennas, the reception antennas 104 are preferably arranged with an equal distance from the central portion. The reception antennas 104 are preferably arranged with an equal interval. The reception antenna 104 is preferably arranged to be enclosed by the static magnet field source 101. In FIG. 3, twenty reception antennas 104 are provided. The reception unit 107 and the like may be provided inside of the housing 111. When the superconductor is used, the size of the reception antenna 104 can be greatly reduced, and many antennas can be provided in the housing. As long as it is a magnetic resonance imaging apparatus of which diameter of a hollow opening portion (subject body area) of the housing 111 is 70 cm and of which external magnetic field intensity is 1.5 T, for example, fifty reception antennas 104 are provided inside of the superconducting coil, and further, several dozen rows of them may be provided. Since an extremely large number of reception antennas 104 can be used to capture images, high resolution image-capturing can be done, which could not be achieved by any externally-attached reception antenna. With regard to these features, a conventional reception coil exhibits a high loss and it is difficult to reduce the size of the reception coil, and it is necessary to bring the reception coil substantially into contact with the subject body in order to increase the sensitivity, and therefore, the antenna cannot be placed inside of the housing inside of the superconducting coil because of the limitations of the size and the characteristics even if tried to, or only up to ten reception antennas can be placed even if they can be placed. In the embodiment, the reception antenna 104 itself is small, and the sensitivity is increased by making multiple superconducting small antennas into an array, and therefore, the characteristics can be obtained even if they are placed away from the subject body, and in addition, because of their small sizes, several dozen antennas can be arranged inside of the superconducting coil, and the measurement can be done with a higher sensitivity as compared with a conventional case.

Figure 4:
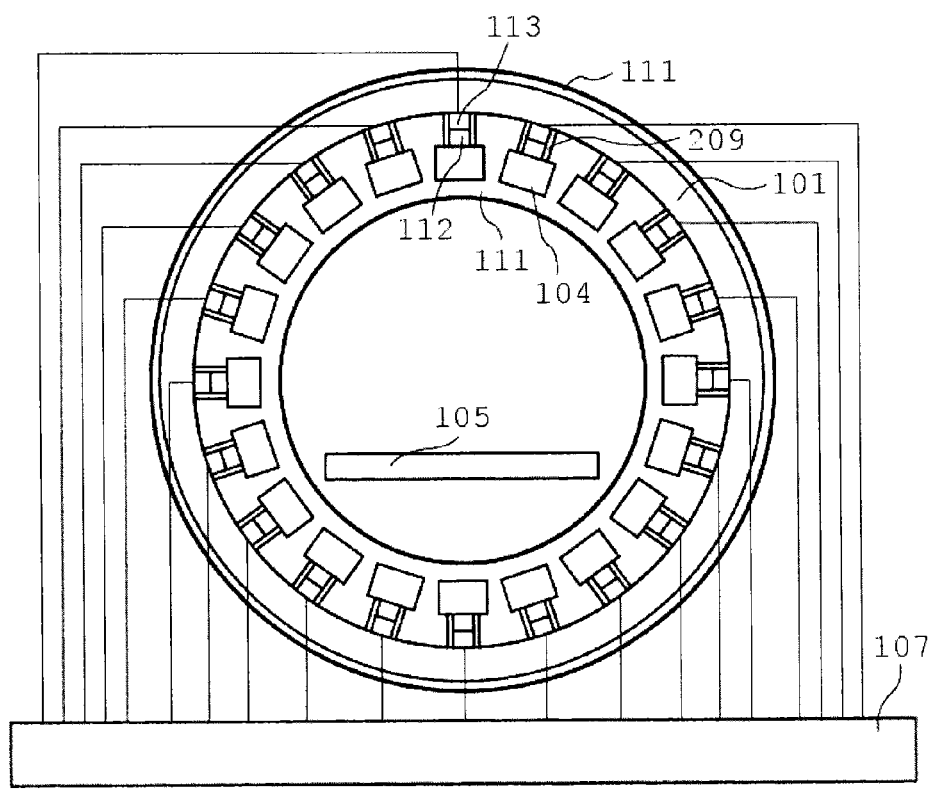
FIG. 4 is a schematic view illustrating a magnetic resonance imaging apparatus according to the embodiment.

Subsequently, FIG. 4 illustrates a cross sectional schematic view of a magnetic resonance imaging apparatus having the reception antennas 104 according to the embodiment provided in the housing. The superconducting coil of the static magnet field source 101 and the reception antenna 104 are cooled by the same cooling refrigerant. The magnetic resonance imaging apparatus in the schematic views of FIGS. 4 and 3 are different in that the cold head 209 is connected to the low temperature area of the static magnet field source 101 and the reception antenna 104. In order to make the superconducting coil of the static magnet field source 101 into the superconducting state, it is necessary to cool the superconducting coil of the static magnet field source 101, and therefore, the cooling may also be applied to the reception antenna 104. In the apparatus according to this configuration, it is not necessary to separately provide a refrigerator to cool the reception antenna 104, and the apparatus can be made efficiently.

A phased array antenna may be used as the reception antennas 104 so that the direction in which the reception antenna 104 is oriented can be changed to any direction. In this case, a phase shifter is provided in the reception antenna 104 or outside thereof.

The top plate 105 is supported by a bed, not shown. The subject body is placed on the top plate 105 when images are captured, and the top plate 105 as well as the subject body are moved into the image-capturing area.

The reception unit 107 receives the magnetic resonance signal converted into the digital signal from the analog signal received by the reception antenna 104. Raw data are generated by digitally processing the received magnetic resonance signal as necessary. Then, the reception unit 107 transmits the generated raw data to the control device 110. The reception unit 107 can control operation of the A/D conversion element 113.

The transmission unit 108 transmits high frequency pulses to the transmission coil 103 on the basis of a command given by the control device 110. The transmission unit 108 has a high frequency electric power supply for generating high frequency pulse transmitted to the transmission coil 103.

The gradient magnetic field electric power supply 109 provides an electric current to the gradient magnetic field coil 102 on the basis of a command given by the control device 110.

The control device 110 drives each of the gradient magnetic field electric power supply 109, the transmission unit 108, and the reception unit 107, thus captures images of the subject body. When the raw data are transmitted from the reception unit 107 as a result of the image-capturing process, the control device 110 can calculate the raw data, output the raw data as image data, transmit the data to an external device or an internal device for data processing and data saving, save the output image data, or display the output image data on a monitor.

In the image-capturing process according to the embodiment, the antenna can process the received signal without loss in the post processing. Therefore, images can also be captured without pre-scanning. The magnetic resonance imaging apparatus may be used as a diagnosis apparatus during operation. At this occasion, it is not necessary to attach any coil to a patient, and therefore, the apparatus according to the embodiment can be used to perform hygienic diagnosis in a short time similarly to CT (computed tomography).

Second Embodiment

Figure 5:
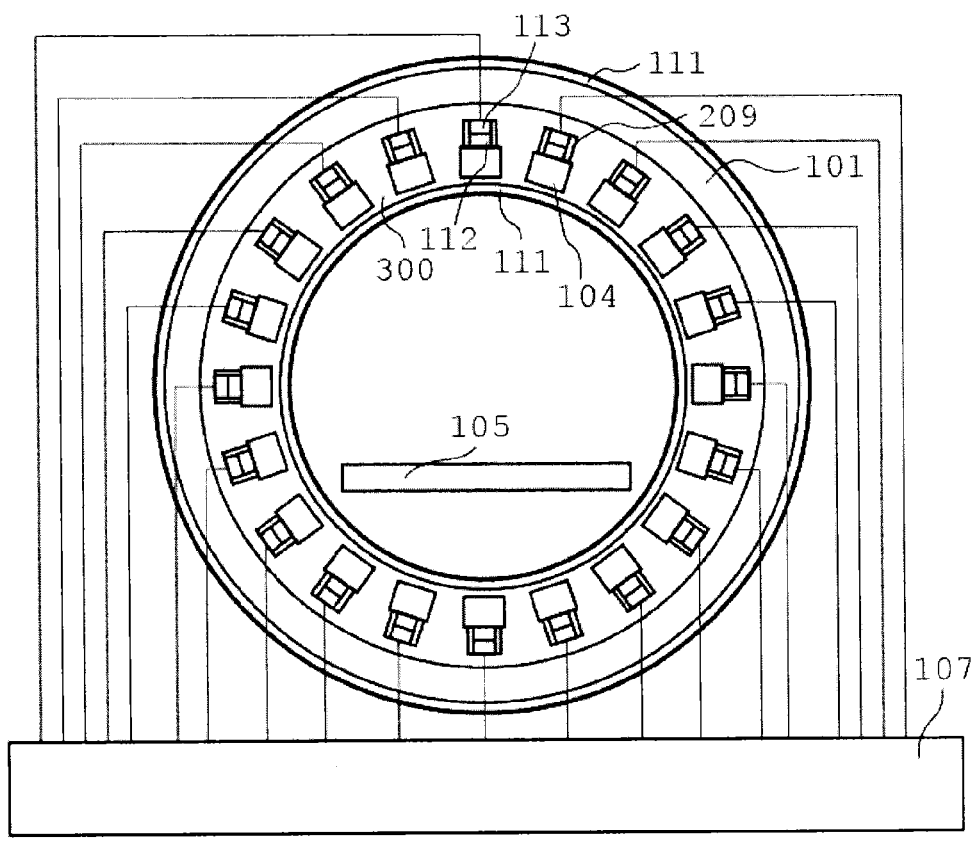
FIG. 5 is a schematic view illustrating a magnetic resonance imaging apparatus according to the embodiment.

FIG. 5 illustrates a cross sectional schematic view of a magnetic resonance imaging apparatus having the reception antennas 104 according to the embodiment in the housing. The magnetic resonance imaging apparatus as shown in the schematic view of FIG. 3 includes a static magnet field source 101, reception antennas 104, a reception unit 107, superconducting filters 112, A/D conversion elements 113, cold heads 209, and a second refrigerant container 300, which are provided in the housing 111, and a top plate 105 on which a test subject is placed is arranged in an image-capturing area during image-capturing process. The magnetic resonance imaging apparatus of FIG. 5 is the same as the magnetic resonance imaging apparatus of FIG. 3 except the configuration of the second refrigerant container 300. In the second embodiment, description about the same features as the above embodiment will be omitted.

In the second embodiment, a specific form of magnetic resonance imaging apparatus will be explained about the cooling of the reception antenna 104. The superconducting coil of the static magnet field source 101 is cooled by a cooling refrigerant such as liquid helium, but in order to prevent the heat from affecting the liquid helium, at least a portion of or all of the vacuum container having a first refrigerant container accommodating the liquid helium is preferably covered with a second refrigerant container 300 accommodating a cooling refrigerant (cryogen) including liquid helium or liquid nitrogen. In the present embodiment, the second refrigerant container 300 accommodating the cooling refrigerant is effectively made use of in terms of thermal and spatial point of view. At least the superconducting array antenna of the reception antenna 104 is cooled by the cooling refrigerant (mainly liquid nitrogen from the perspective of the cost), and is cooled to the superconducting state. Therefore, the superconducting member used for the reception antenna 104 is preferably a so-called high temperature superconductor. The reception antenna 104 is arranged in the refrigerant container of liquid nitrogen which is also used in the conventional magnetic resonance imaging apparatus requiring the external reception antenna, so that the image-capturing area (opening diameter) does not decrease at all or hardly decreases.

Figure 6:
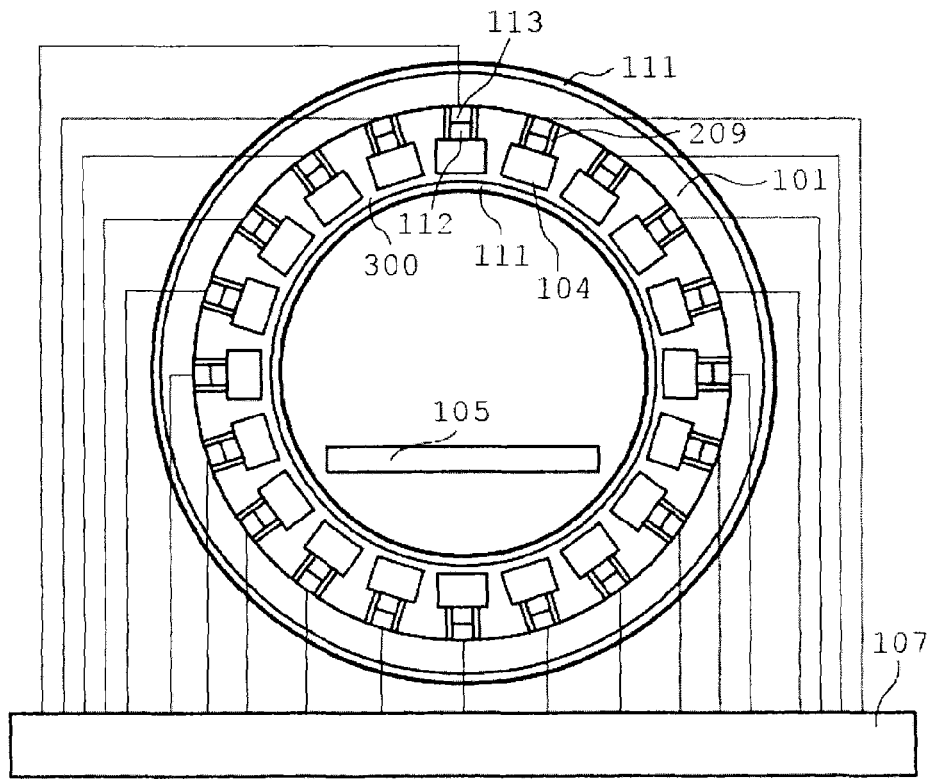
FIG. 6 is a schematic view illustrating the magnetic resonance imaging apparatus according to the embodiment.

FIG. 6 illustrates a magnetic resonance imaging apparatus having the second refrigerant containers 300 which is added to the magnetic resonance imaging apparatus as show in FIG. 4 of the first embodiment. The second refrigerant container 300 and the cold head 209 are connected. In this embodiment, the same effects as those of the above embodiment are achieved by the second refrigerant container 300.

Third Embodiment

Figure 7:
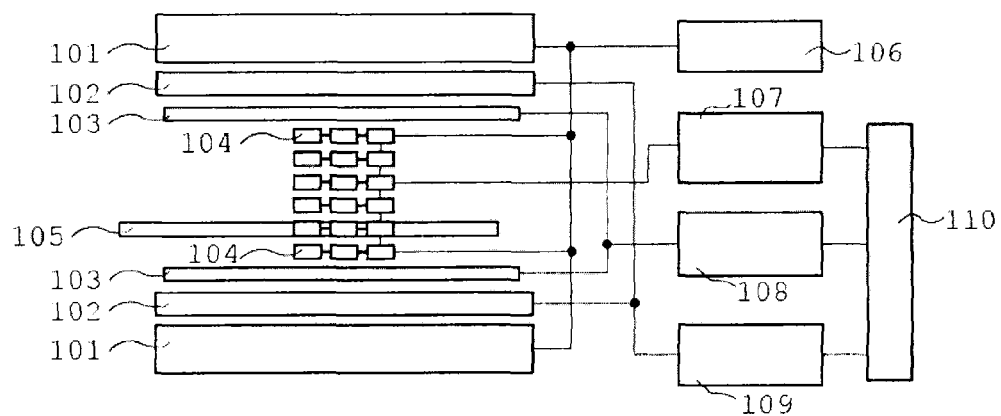
FIG. 7 is a configuration schematic view illustrating a magnetic resonance imaging apparatus according to an embodiment.

The third embodiment relates to a vertical magnetic field type magnetic resonance imaging apparatus. FIG. 7 illustrates a configuration schematic diagram of the magnetic resonance imaging apparatus according to the third embodiment. The magnetic resonance imaging apparatus of FIG. 7 includes a static magnet field source 101, gradient magnetic field coils 102, a transmission coil 103, reception antennas 104, cooling devices 106, a reception unit 107, a transmission unit 108, a gradient magnetic field electric power supply 109, a control device 110, in order to apply a vertical magnetic field to a subject body. In the image-capturing range, the top plate 105 is provided. The reception antenna 104 is arranged to have the reception surface or the directivity in the direction different from the magnetic field direction of the vertical magnetic field, for example in the direction perpendicular to the vertical magnetic field. In the third embodiment, description about the same features as the above embodiment will be omitted.

The static magnet field source 101 may be a superconducting coil magnet or a permanent magnet. When the static magnet field source 101 is a permanent magnet, the cooling device 106 liquefies liquefied cooling refrigerant for cooling the reception antenna 104. In this case, the cooling refrigerant preferably includes liquid nitrogen or liquid helium.

Figure 8:
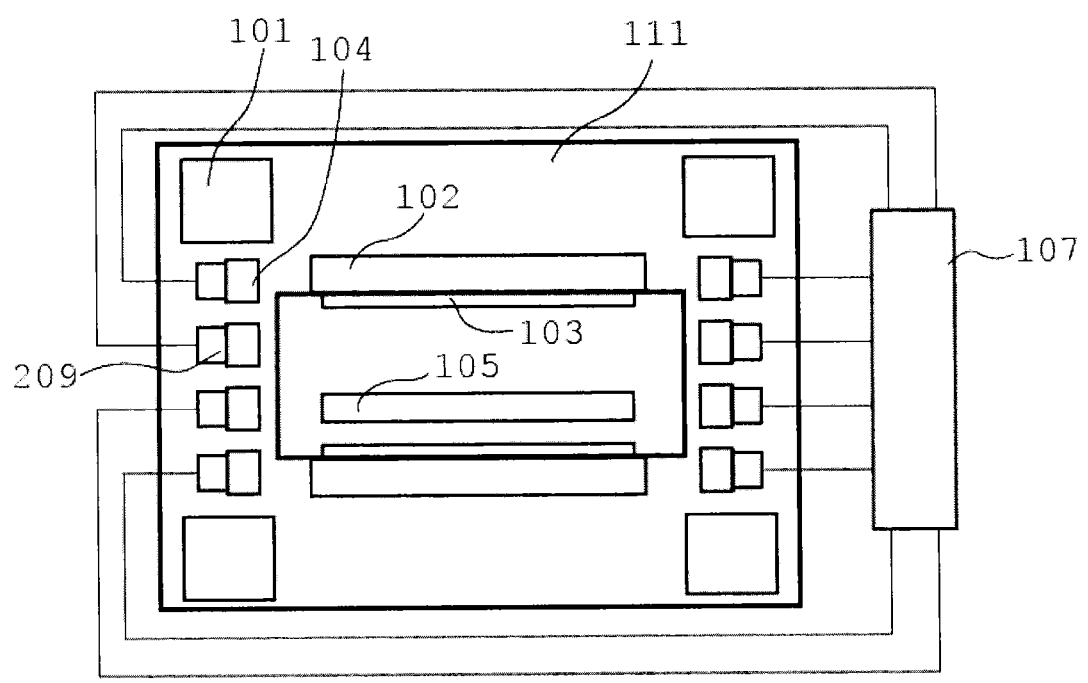
FIG. 8 is a schematic view illustrating the magnetic resonance imaging apparatus according to the embodiment.

FIG. 8 is a schematic view illustrating the magnetic resonance imaging apparatus in a cross section taken in another direction according to the third embodiment. In FIG. 8, some of the elements such as the cooling device 106 are not shown. The magnetic resonance imaging apparatus of FIG. 8 includes the static magnet field source 101, the gradient magnetic field coils 102, the transmission coil 103, the reception antennas 104, the reception unit 107, the housing 111, the superconducting filter 112, the A/D conversion element 113, and the cold head 209. The top plate 105 on which the test subject is placed when images are captured is arranged in the image-capturing area.

In the magnetic resonance imaging apparatus of FIG. 8, the reception antennas 104 cooled in the refrigerant container 300 accommodating the cooling refrigerant including liquid helium or liquid nitrogen are provided between the static magnet field source 101. The reception antennas 104 are arranged in a pillar area in the housing 111. The vertical magnetic field magnetic resonance imaging apparatus is called an open type, and is preferably open except the area of the pillars.

The third embodiment is the vertical magnetic field type, and therefore, the static magnet field source 101 and the like are separated into image-capturing areas in the vertical direction. The configuration including the static magnet field source 101 separated in the vertical direction is supported by the pillars of the housing 111. The reception antennas 104 may be arranged in a single pillar. The reception antennas 104 of the embodiment are preferably provided in the pillar, so as to have a directivity in the direction of the image-capturing area. In this case, for example, there are two pillars, but the number of pillars and the ratio of pillars having the reception antennas 104 arranged therein may be changed in accordance with the design of the magnetic resonance imaging apparatus. In FIG. 8, four reception antennas 104 are arranged in a row, but the number of reception antennas 104 which can be arranged in the housing 111 changes according to the reception frequency, and therefore, the number of antennas shown in the drawing is merely an example. In another example, ten reception antennas 104 may be provided by row, and ten rows are provided, which means that totally one hundred reception antennas 104 can be arranged in a single pillar.

As described above, the reception antennas 104 are arranged in the pillars required by the vertical magnetic field type magnetic resonance imaging apparatus, so that the reception antennas 104 can be arranged in the housing without narrowing the opening area and the image-capturing area at all or hardly narrowing the opening area and the image-capturing area. The present embodiment can also be employed for a magnetic resonance imaging apparatus using permanent magnets.

Fourth Embodiment

Figure 9:
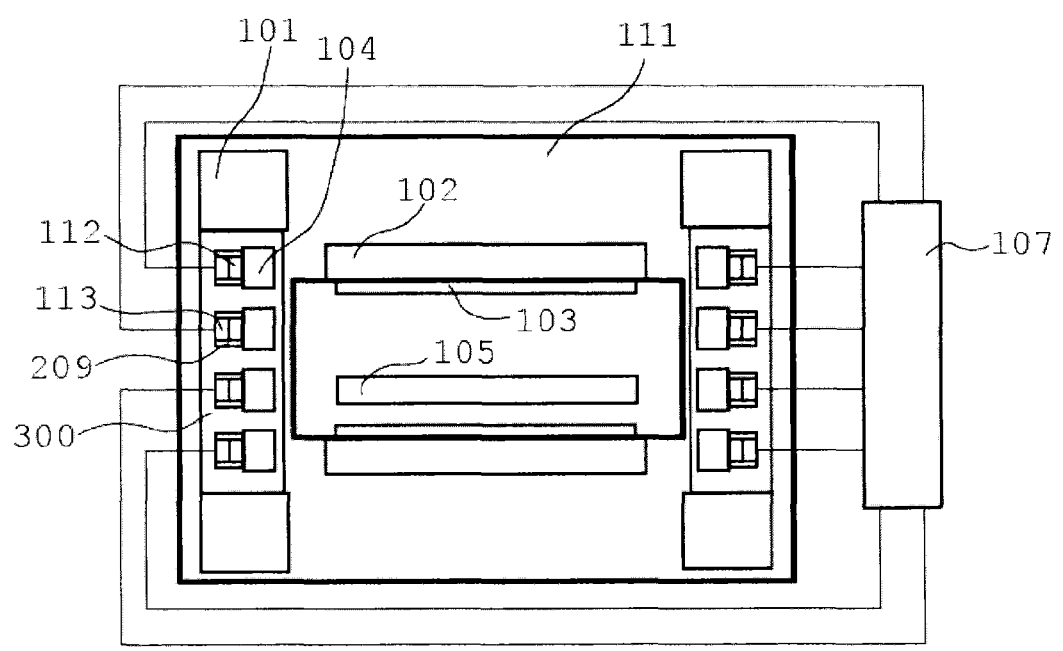
FIG. 9 is a schematic view illustrating an magnetic resonance imaging apparatus according to an embodiment.

A magnetic resonance imaging apparatus according to the fourth embodiment is made by employing the cooling using liquid nitrogen according to the second embodiment for the magnetic resonance imaging apparatus according to the third embodiment. FIG. 9 illustrates a schematic view of the magnetic resonance imaging apparatus according to the fourth embodiment. The magnetic resonance imaging apparatus of FIG. 9 includes a static magnet field source 101, gradient magnetic field coils 102, a transmission coil 103, reception antennas 104, a reception unit 107, a housing 111, a superconducting filter 112, A/D conversion elements 113, cold head 209, and a second refrigerant container 300 accommodating a cooling refrigerant such as liquid nitrogen. In the present embodiment, a magnet using a superconducting coil is used for the static magnet field source

101. At least a portion of or all of the vacuum container accommodating the first refrigerant container accommodating the superconducting coil is preferably covered with the second refrigerant container accommodating the superconducting antenna. In the fourth embodiment, description about the same features as those of the above embodiments is omitted. The effects obtained by this configuration are what have been described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   a housing,
   a static magnet field source having a superconducting coil or a permanent magnet,
   a superconducting array antenna which is provided inside of the housing, and
   an A/D conversion element configured to convert a received analog signal into a digital signal,
   wherein the A/D conversion element is disposed on the superconducting array antenna.

2. The apparatus according to claim 1, wherein the superconducting array antenna includes a superconducting filter, and
   the A/D conversion element is an element configured to convert a signal of which band width has been restricted by the superconducting filter.

3. The apparatus according to claim 1, wherein the superconducting array antenna includes a superconducting filter,
   the superconducting filter includes a plurality of superconducting filters,
   the superconducting filters restrict band widths of the received analog signals in different frequency bands respectively, and
   the A/D conversion element is an element configured to convert the analog signals of the frequency bands of which band width have been restricted by the superconducting filters into digital signals.

4. The apparatus according to claim 1, wherein the static magnet field source is a static magnet field source having a superconducting coil, and
   the superconducting array antenna is arranged on a circumference inside of the superconducting coil.

5. The apparatus according to claim 1, wherein the static magnet field source is a static magnet field source having a superconducting coil, and
   the superconducting array antenna is arranged with an equal interval on a circumference inside of the superconducting coil.

6. The apparatus according to claim 1, wherein the static magnet field source is a static magnet field source having a superconducting coil, and
   the superconducting array antenna is arranged to be enclosed by the static magnet field source.

7. The apparatus according to claim 1, wherein the static magnet field source is a static magnet field source having a superconducting coil, and
   the superconducting array antenna has a directivity in a direction of a central portion of the housing.

8. The apparatus according to claim 1, wherein the superconducting array antenna includes one row or two or more rows.

9. The apparatus according to claim 1, wherein the superconducting coil and the superconducting array antenna are cooled by a same cooling medium.

10. The apparatus according to claim 1, wherein the superconducting array antenna includes a superconducting filter and a low noise amplification device.

11. The apparatus according to claim 1, wherein the superconducting array antenna is a phased array antenna, and
    the superconducting array antenna is connected to a phase shifter.

12. The apparatus according to claim 1, wherein the superconducting coil and the superconducting array antenna are cooled into a superconducting state.

13. The apparatus according to claim 1 further comprising a refrigerant container accommodating a cooling refrigerant including liquid helium or liquid nitrogen,
    wherein the superconducting array antenna is accommodated in the refrigerant container.

14. The apparatus according to claim 1, wherein the static magnet field source includes a vacuum container, a refrigerant container accommodating a cooling refrigerant in the vacuum container, and the superconducting coil in the refrigerant container, and
    at least a portion of the vacuum container is covered with a refrigerant container accommodating the superconducting array antenna.

* * * * *